United States Patent
Yamazaki et al.

[11] Patent Number: 6,027,987
[45] Date of Patent: Feb. 22, 2000

[54] METHOD OF MANUFACTURING A CRYSTALLINE SEMICONDUCTOR

[75] Inventors: Shunpei Yamazaki, Tokyo; Hisashi Ohtani, Kanagawa, both of Japan

[73] Assignee: Semiconductor Energy Laboratory Co., Ltd., Kanagawa-ken, Japan

[21] Appl. No.: 08/962,234

[22] Filed: Oct. 31, 1997

[30] Foreign Application Priority Data

Oct. 31, 1996 [JP] Japan .................................... 8-307445

[51] Int. Cl.[7] ............................ H01L 21/20; H01L 21/36; H01L 21/00; H01L 21/84
[52] U.S. Cl. ............................ 438/486; 438/487; 438/166; 438/164
[58] Field of Search ....................... 438/164, 166, 438/486, 522, 530, 718, 719, 725, 798, 907, 487

[56] References Cited

U.S. PATENT DOCUMENTS

| 5,643,826 | 7/1997 | Ohtani ..................................... 438/162 |
| 5,654,203 | 8/1997 | Ohtani ....................................... 438/97 |
| 5,693,541 | 12/1997 | Yamazaki ................................. 437/21 |
| 5,869,363 | 2/1999 | Yamazaki ............................... 438/166 |
| 5,894,137 | 4/1999 | Yamazaki ................................... 257/66 |

FOREIGN PATENT DOCUMENTS

| 7-045519 | 2/1995 | Japan . |
| 7-066452 | 3/1995 | Japan . |
| 7-130652 | 5/1995 | Japan . |
| 7-335548 | 12/1995 | Japan . |

*Primary Examiner*—Charles Bowers
*Assistant Examiner*—Nema Berezny
*Attorney, Agent, or Firm*—Fish & Richardson P.C.

[57] ABSTRACT

A silicon oxide film is used as a mask covering an amorphous silicon film. A film having a catalyst element such as nickel for promoting crystallization is formed. When heat annealing is applied, the catalyst element diffuses from the aperture into the amorphous silicon film to obtain a crystalline silicon film. The silicon film has uniformly orientated crystals. Then, a halogen-containing gas (for example, hydrogen chloride) is introduced while the mask in place. In this step, the atmosphere and the temperature are controlled to form, on the silicon film in the portion of the aperture, an oxide film of such a thickness as allowing the catalyst element to pass but not etching the silicon film. The catalyst element in the silicon film is removed by halogen through the aperture, but the crystallinity of silicon does not change. Thus, a silicon film of good crystallinity can be obtained.

64 Claims, 4 Drawing Sheets

METHOD OF MANUFACTURING A CRYSTALLINE SEMICONDUCTOR

BACKGROUND OF THE INVENTION

1. Field of the Invention

The present invention is directed to a method of manufacturing a crystalline silicon semiconductor film, for example, a polycrystal silicon film, a single crystal silicon film and a microcrystalline silicon film. The crystalline silicon film manufactured by using the present invention is used for various kinds of semiconductor devices.

2. Prior Art

A thin film transistor (hereinafter referred to as TFT) using a thin film semiconductor has been known. This is prepared by forming a thin film semiconductor, particularly, a silicon semiconductor film on a substrate and constituted by using the thin film semiconductor. While TFTs have been utilized in various kinds of integrated circuits, they have been particularly noted as switching elements disposed with each of picture elements or driver elements formed to peripheral circuit portions of an active matrix type liquid crystal display device.

As the silicon film utilized for TFT, it is easy and convenient to use an amorphous silicon film but it involves a problem that the electrical characteristics are much lower than those of single crystal semiconductors used for semiconductor integrated circuits. Therefore, the silicon film has been used only in restricted application uses such as switching elements in the active matrix circuit. The characteristics of TFT may be improved by using thin crystalline silicon films. Those silicon films having crystallinity, other than single crystal silicon, are referred to as a polycrystal silicon, polysilicon, microcrystalline silicon or the like. Such a crystalline silicon film can be obtained by at first forming an amorphous silicon film, and then crystallizing the same by heating (heat annealing). This method is referred to as a solid phase growth method since the amorphous state changes into the crystal state while maintaining the solid state.

It has been confirmed that if an appropriate metal element is added in the step of the solid phase growth, the element functions as a catalyst to promote crystallization. Namely, it has been found that crystallization can be attained at 550° C. and by a treating time for about 4 hours, by depositing one or plurality of elements selected from the group consisting of nickel, palladium platinum, copper, silver, gold, indium, tin, phosphorus, arsenic and antimony (more generally from the elements belonging to the groups VIII, IIIb, IVb and Vb of the periodic table of the former international notation) in a minute amount on the surface of an amorphous silicon film and then heating them (as disclosed in Japanese Patent Laid-Open No. 6-244103, etc.). The No. 6-244,103 corresponds to U.S. Pat. No. 5,639,698.

The orientation of crystals of the silicon film obtained when a catalyst element film is formed uniformly on the entire surface of the amorphous silicon film at random but it has been also known that the crystal orientation can be controlled by selective addition as disclosed, for example, in Japanese Patent Laid-Open No. 7-45519 (which corresponds to U.S. Pat. No. 5,403,772 or No. 7-66425 which corresponds to U.S. Pat. No. 5,534,716). The crystalline silicon film of such uniform crystal orientation has a great worth in view of manufacture of devices, and a method of taking place such crystal growth is called as lateral growth.

However, it is an innegligible problem that the catalyst element introduced in the silicon film gives undesired effects on the electrical characteristics and reliability. It has been generally known that nickel, palladium, platinum, copper, silver and gold, among the catalyst elements, form chlorides and evaporate when heated at a high temperature in an atmosphere containing a halogen compound (particularly, hydrogen halide). However, if they are contained in silicon, since silicon also forms a chloride (dichlor silane or the like) and evaporates, it is difficult to selectively remove only the catalyst element.

For preventing evaporation of silicon, it has been adopted a method of applying heat annealing in an oxidizing atmosphere, thereby forming a silicon oxide layer on the surface of the silicon film, condensing the catalyst element therein and removing the silicon oxide layer thereby removing the catalyst element from the silicon film as disclosed in Japanese Patent Laid-Open No. 7-183538.

A treatment at a high temperature of 700° C. or more is essential for obtaining such silicon oxide and this offsets the effect of low temperature crystallization due to the catalyst element, and it has been demanded for removing the same at a lower temperature.

A method of using a heated silicon will be explained simply with reference to FIG. 2. On a substrate 11, are formed an underlying insulation film 12 such as silicon oxide and an amorphous silicon film 13. A mask film 14 is formed with a material such as silicon oxide or silicon nitride on the amorphous silicon film. An aperture 15 is formed to the mask film 14 for introducing a catalyst element (FIG. 2(A)).

Figure 1A:
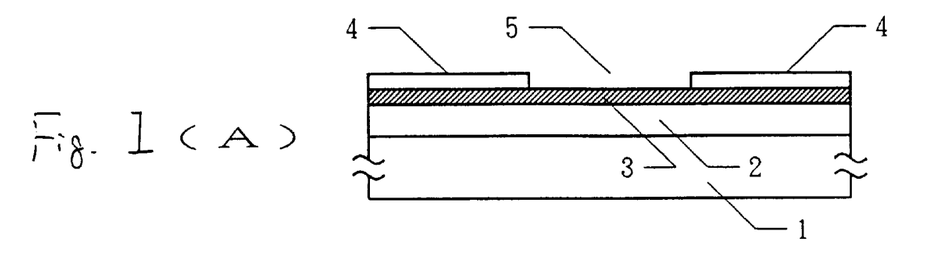
FIGS. 1(A) to 1(E) are cross sectional views showing a basic constitution of the present invention.
Figure 1B:
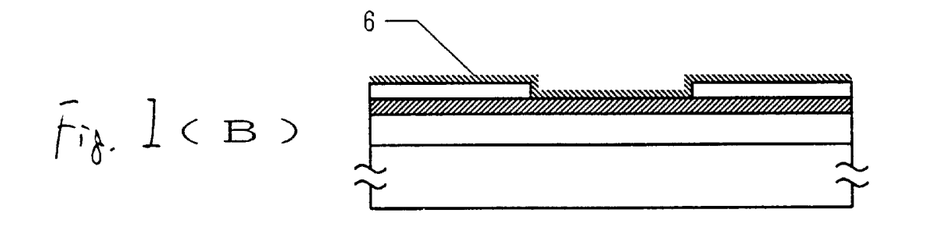
Figure 1C:
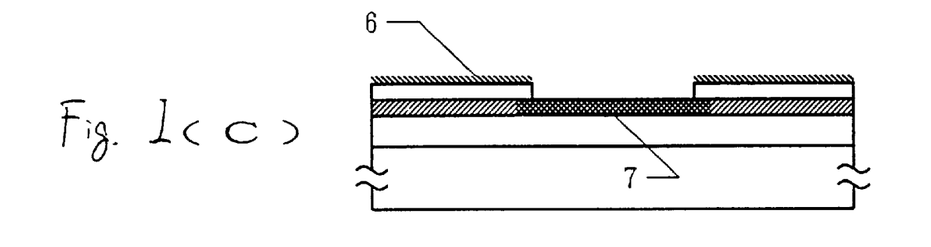
Figure 1D:
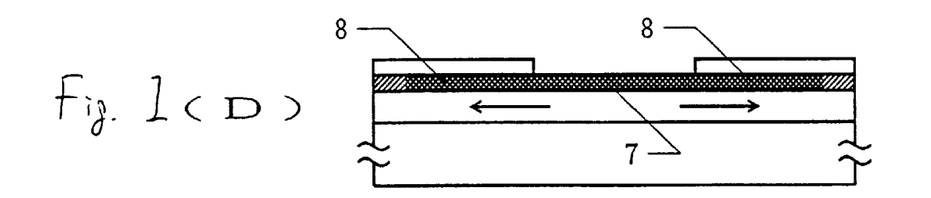
Figure 1E:
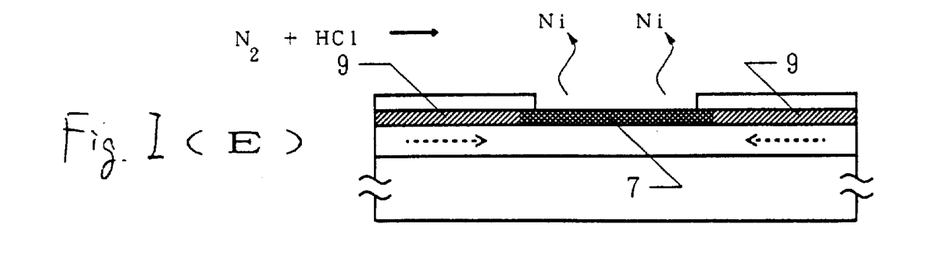
Figure 2A:
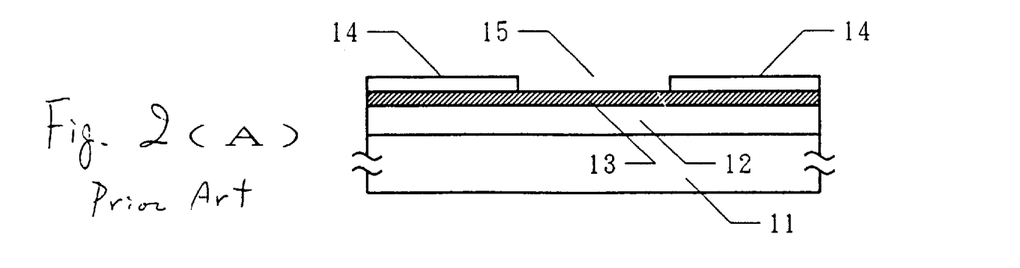
FIGS. 2(A) to 2(F) are cross sectional views showing existent steps of removing a catalyst element.
Figure 2B:
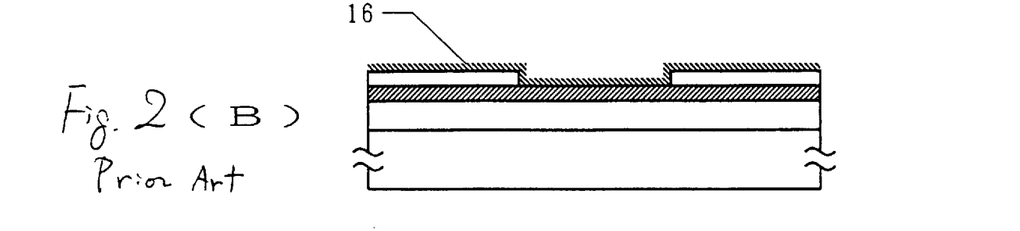

Then, a catalyst element or a catalyst element-containing film (for example, nickel silicide, nickel acetate or the like) 16 is deposited. The deposition means usable herein can include, for example, a sputtering method (Japanese Patent Laid-Open No. 7-45519 and No. 7-66452), gas phase growth method (Japanese Patent Laid-Open No. 7-335548), and spin coating method (Japanese Patent Laid-Open No. 7-130652) (FIG. 2(B)). The Japanese Laid-Open No. 7-130,652 corresponds to U.S. Pat. No. 5,643,826.

Figure 2C:
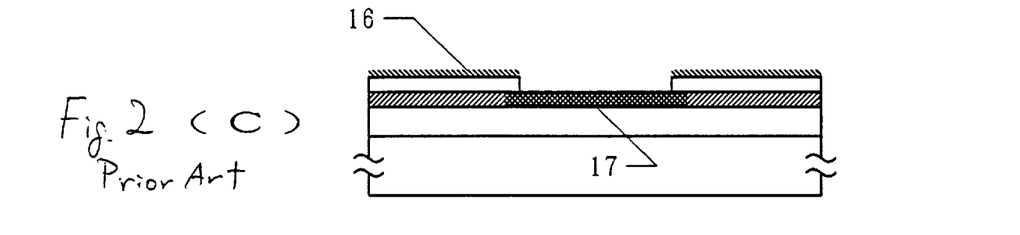

Then, when heat annealing is applied at an appropriate temperature, the catalyst element at first crystallizes the amorphous silicon film at a portion 17 just beneath the aperture 15 (FIG. 2(C)).

Figure 2D:
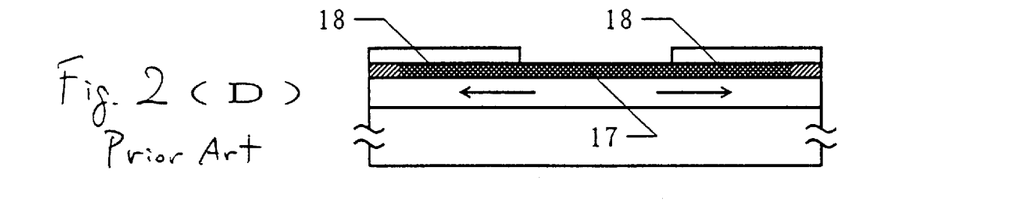

Subsequently, the catalyst element diffuses laterally along with proceeding of crystallization and crystallizes also a portion 18 apart from the aperture 15 (this referred to as lateral growth) (FIG. 2(D)).

Figure 2E:
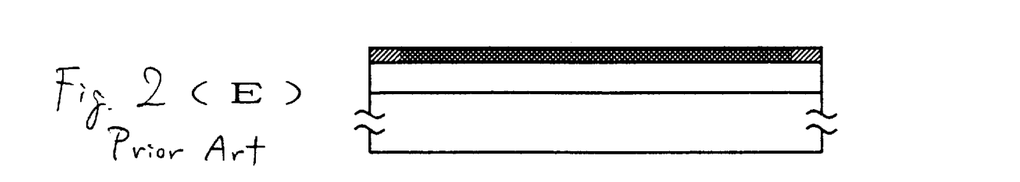

Then, the mask film 14 is removed (FIG. 2(E)).

Figure 2F:
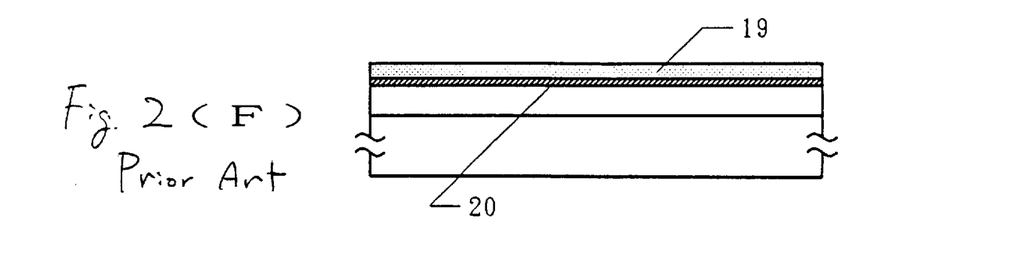

Then, the silicon film is oxidized at a temperature and in an atmosphere for oxidizing the silicon film to obtain a silicon film 20 in which the concentration of the catalyst element is lowered and a silicon oxide film (thermally oxidized film) 19 in which the concentration of the catalyst element is high. When a halogen-containing gas (for example, silicon chloride) is added in the atmosphere, the catalyst element contained in the thermally oxidized film 19 forms a chloride and is removed (FIG. 2(F)).

The steps described above involve the following drawbacks.

(1) A heat treatment at a high temperature (700° C. or higher) is necessary.

(2) Since the mask film is etched, it has to be taken out once to the outside.

SUMMARY OF THE INVENTION

The present invention intends to overcome the drawbacks described above entirely or partially.

The foregoing object can be attained in accordance with the present invention by forming a mask selectively having a catalyst element introduction aperture on an amorphous silicon film, forming a film having a catalyst element, for example, by a sputtering method, gas phase method, spin coating or the like and then applying annealing at an appropriate temperature thereby conducting lateral growth of an amorphous silicon film. Successively, the catalyst element in the silicon film is discharged through the catalyst element introduction aperture by heating in an atmosphere having a halogen compound (for example, hydrogen chloride) at a temperature from 450 to 700° C.

It is necessary that the atmosphere for the step of removing the catalyst element satisfies the condition of forming, an oxide film of such a thickness as permitting the catalyst element to pass therethrough but not etching the silicon film (preferably from 20 to 150Å) on the surface of the catalyst element discharging aperture. Preferably, the atmosphere comprises hydrogen chloride, oxygen, nitrogen and a rare gas as a main ingredient and contains from 20 to 95%, preferably, from 50 to 70% of nitrogen or rare gas and from 5 to 40% of oxygen.

Further, the concentration of the halogen compound differs depending on the material but a sufficient effect can be obtained in a case of hydrogen chloride, which is generally usable easily, so long as it is contained by more than 0.5%.

The present invention has a feature of adding the step of the catalyst element treatment to the existent lateral growth step. Then, the step of the catalyst element treatment has a feature capable of continuously transferring from the lateral growth step and, in this regard, has higher productivity and requires lower treatment temperature compared with the existent method as shown in FIGS. 2(A) to 2(F). The step for the catalyst element treatment may be conducted by merely changing the atmosphere and the temperature in the furnace used for the solid phase growth step. Since this step also serves as cleaning for the inside of the furnace, no additional facility is required.

The crystalline silicon film obtained as described above may be subsequently exposed to laser or like other intense light, thereby improving the crystallinity.

Further, in view of the enhancement for the intimate contact with the catalyst element containing film, an oxide film of less than 100Å may be formed on the amorphous silicon film to the portion for the catalyst element introduction aperture.

Further, in the step described above, the temperature upon transfer from the lateral growth step to the catalyst element removing step is preferably 450° C. or higher. This is because the solubility of nickel in silicon is lowered and nickel is deposited as nickel silicide if the substrate temperature is lowered, and such deposits remain as crystal defects although nickel is removed in the subsequent step, to give undesired effects on the electrical characteristics. Such deposition is observed particularly when the temperature lowers to less than 450° C.

In the present invention, a most remarkable effect can be obtained with the use of nickel as the catalyst element. Other catalyst elements usable herein, there can be mentioned, preferably, Pd, Pt, Cu, Ag, Au, In, Sn, P, As and Sb. Further, one or plurality kinds of elements selected from the group of those belonging to the groups VIII, IIIb, IVb, and Vb may also be utilized.

DESCRIPTION OF PREFERRED EMBODIMENTS

Embodiment

This embodiment shows an example of forming a crystalline silicon film on a glass substrate and manufacturing a thin film transistor (TFT) by using the same. In this embodiment, Corning 7059 glass was used for the substrate. Further, the glass substrate was sized as 100 mm×100 mm.

At first, an amorphous silicon film was formed to a thickness of 100 to 1500Å on a substrate 31 coated with a silicon oxide film of 2000Å thickness (not illustrated) by a plasma CVD method or an LPCVD method. In this embodiment, the amorphous silicon film 32 was deposited to a film thickness of 500Å by the plasma CVD method.

Further, a silicon oxide film 33 as a mask film was formed to a thickness of more than 1000Å, and 1200Å, in this case, by a sputtering method. For the thickness of the silicon oxide film 33, while it was confirmed that a thickness of 500Å caused no problem by the experiment of the present inventors, a further margin was provided there in order to prevent intrusion of nickel into an unintended portion, for example, caused by the presence of pinholes. Then, the silicon oxide film 33 is patterned by a usual photolithographic step into a required pattern to form windows 34a, 34b for the introduction of nickel (required) (FIG. 3(A)).

To the thus fabricated substrate, a super thin film 35 of nickel acetate was formed by a spin coating method. The step will now be explained simply. At first, contaminates and spontaneous oxide films present at the nickel introduction apertures 34a, 34b are removed at first by slightly treating with hydrofluoric acid. The step may be omitted if the time interval between the etching step and this step is short. Then, UV-ray irradiation is applied in an oxygen atmosphere to thereby form an extremely thin silicon oxide film (10–50Å) to the apertures 34a and 34b.

The thickness of the silicon oxide can be determined depending on the UV-ray irradiation time. Instead of UV-irradiation, a thermal oxidation method may be used or an oxidant such as hydrogen peroxide may be used. The silicon oxide film thus formed is necessary for improving the contaminate contact between the nickel acetate solution and the silicon film and, without such oxidizing treatment, the nickel acetate film is not formed in the apertures 34a and 34b since silicon repels the aqueous solution.

Figure 3:
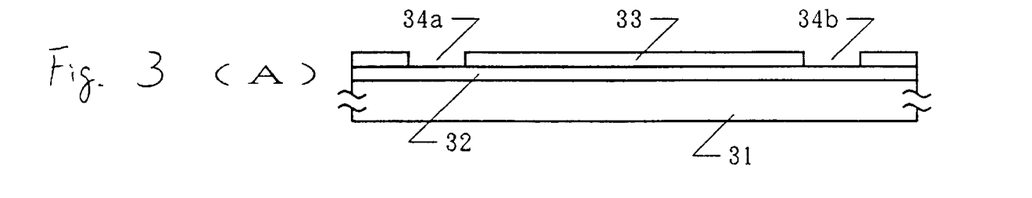
FIGS. 3(A) to 3(G) are cross sectional views showing steps for manufacturing TFT in a preferred embodiment of the present invention.

Then, after dropping 2 ml of an aqueous nickel acetate solution (nickel concentration: 100 ppm) by 2 ml on the substrate and keeping the state for 5 min, spin drying (at 2000 rpm, for 60 sec) was applied after maintaining the state for 5 min (FIG. 3(B)).

Then, the amorphous silicon film 32 was crystallized by applying a heat treatment at 550° C. (nitrogen atmosphere) for 8 hours. In this step, the nickel acetate film is thermally decomposed rapidly to form a nickel film, and crystallization was initiated at a portion in which the nickel film adhered to the amorphous silicon film. Then, crystallization proceeds to the periphery as shown by the arrow in the drawing, and crystallization was also taken place also in a region covered with the mask 33. Thus, crystallized silicon films 36a and 36b were obtained. Further, crystallization proceeding from the aperture 34a and crystallization proceeding from the aperture 34b met substantially at a central portion where a grain boundary 37 was formed. The nickel concentration was particularly high in this portion (FIG. 3(C)).

Then, hydrogen chloride was introduced to the atmosphere while maintaining the temperature at 550° C. to remove nickel. In this embodiment, the partial pressure for nitrogen was 88%, the partial pressure for oxygen was 10% and the partial pressure for hydrogen chloride was 2%. Nickel was removed by leaving in this state for 10 to 60 min.

In this case, it is important to transfer the step while maintaining the substrate temperature. That is, if the substrate temperature is lowered, solubility of nickel in silicon is lowered and nickel is deposited as nickel silicide. Such deposits remain as crystal defects even if nickel is removed in the subsequent step to give undesired effects on electrical characteristics. Particularly, such deposition is observed when the temperature is lowered to less than 450° C.

However, when the step is transferred continuously without changing the substrate temperature as in this embodiment, since nickel is removed without deposition, the problem described above does not occur. In addition, continuous transfer of the step can be attained easily by changing the introduction of gases.

As a result, the concentration of nickel in the silicon films 36a and 36b was reduced. Further, the concentration of nickel present in the grain boundary 37 was also reduced remarkably, and only an indistinct presence of the grain boundary was confirmed at that portion 38 (FIG. 3(D)).

The solid phase growth (lateral growth) was thus conducted. Then, KrF excimer laser beam (wavelength: 248 nm) may be irradiated to further improve the crystallization. In this case, the energy density of the laser was preferably from 300 to 350 mJ/cm$^2$. In addition to crystallization by the solid phase growth, the crystallinity was further enhanced by irradiation of the laser beam, because the crystallinity is not good in the apertures 34a and 34b in which the nickel film and the amorphous silicon were in intimate contact since the orientation of the crystallinity was not uniform. In particular, many amorphous residues are observed at the crystal grain boundary. Then, it is desirable to completely crystallize as far as the amorphous component in the crystal grain boundary by the irradiation of the laser.

Then, the mask film 33 was removed, the crystallized silicon film was further patterned to form an island-like region 39. The island-like region 39 forms an active layer of TFT (FIG. 3(E)).

Then, a silicon oxide film 40 having a thickness of 200 to 1500Å (100Å in this embodiment) was deposited by a plasma CVD method. The silicon oxide film functions as a gate insulation film. A care has to be taken in the manufacture of the silicon oxide film 40. In this embodiment, TEOS was used as the starting material which was decomposed and deposited by an RF plasma CVD method at a substrate temperature from 150 to 600° C., preferably, from 300 to 450° C. The pressure ratio between TEOS and oxygen is from 1:1 to 1:3, the pressure is from 0.05 to 0.5 Torr, and RF power was from 100 to 250 W.

Alternatively, TEOS was used as the starting material and the film was formed together with an ozone gas by a vacuum CVD method or an atmospheric pressure CVD method at a substrate temperature of from 350 to 600° C., preferably, from 400 to 550° C. After the deposition of the film, it may be annealed in an oxygen or ozone atmosphere at 400–600° C. to 30 to 60 min.

Then, a phosphorus-doped polycrystal silicon film having a thickness of from 2000Å to 1 μm was formed by a vacuum CVD method and etched to form a gate electrode 41 (FIG. 3(F)).

Then, impurities (phosphorus) were injected (implanted) into the island-like silicon film of TFT in the self-alignment manner by an ion doping method (referred to also as plasma doping method). Phosphine (PH$_3$) was used as a doping gas. The dose rate was from $1 \times 10^{14} - 4 \times 10^{25}$ atoms/cm$^2$. Thus, N type impurity (phosphorous) regions (source drain) 42a, 42b were formed.

Then, a silicon oxide film was formed to a thickness of 3000 to 8000Å as an interlayer insulator 43 over the entire surface using TEOS as the starting material by a plasma CVD method together with oxygen or by a vacuum CVD method or atmospheric CVD method together with ozone. The substrate temperature was set 250 to 450° C., for example, at 350° C. After the film deposition, the silicon oxide film may be polished mechanically or flattened by an etching back system for obtaining flatness for the surface.

Then, the interlayer insulator 43 was etched to form a contact hole for source/drain of TFT, and wirings, electrodes 44a, 44b of chromium or titanium nitride and aluminum were formed.

Finally, annealing was applied in hydrogen at 300 to 400° C. for 0.1 to 2 hours to complete hydration of silicon. The TFT was thus completed. A plurality of TFTs may be manufactured simultaneously and arranged in a matrix to be used as an integrated circuit such as an active matrix type liquid crystal display device (FIG. 3(G)).

Figure 4A:
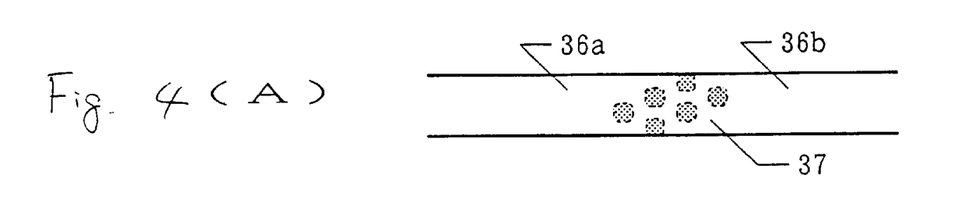
FIGS. 4(A) and 4(B) are conceptional cross sectional views for introduction and removal of a catalyst element.
Figure 5A:
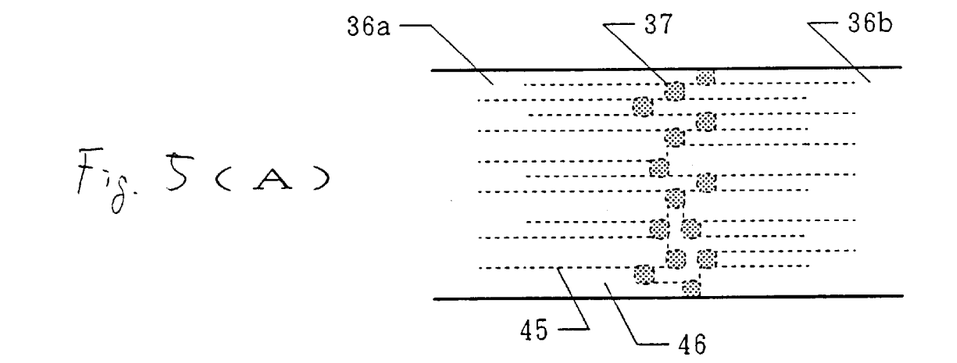
FIGS. 5(A) and 5(B) are conceptional upper plan views for introduction and removal of the catalyst element.
Figure 5B:
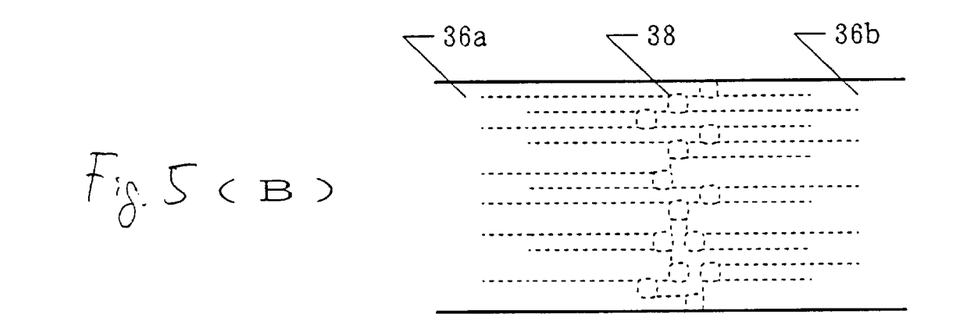

In the present invention, the portion 38 in which the grain boundary was present was used as a channel forming region. This has the following features. At the grain boundary 37, nickel is granular as shown in FIG. 4(A) and FIG. 5(A). In most cases, nickel forms a silicide to exhibit high conductivity. On the other hand, silicon forms crystals 46 elongated in the proceeding direction of the crystallization, and the grain boundary 45 is substantially in parallel with the direction of connecting the source and the drain (carrier advancing direction) (FIG. 4(A): conceptional cross sectional view and FIG. 5(A): conceptional upper plan view).

As a matter of fact, there is a problem in view of the reliability and the characteristics for TFT in which the silicide of conductive material is present in a central portion.

In the present invention, nickel is removed from the active layer by the nickel removing treatment, whereby the granular portion 37 containing nickel at a high concentration present in the grain boundary is almost removed to form a new grain boundary 38. Since the grain boundary 38 has no difference in the composition and, therefore, it is indistinct as compared with the grain boundary 37, so that it does not worsen the semiconductor characteristics.

Figure 4B:
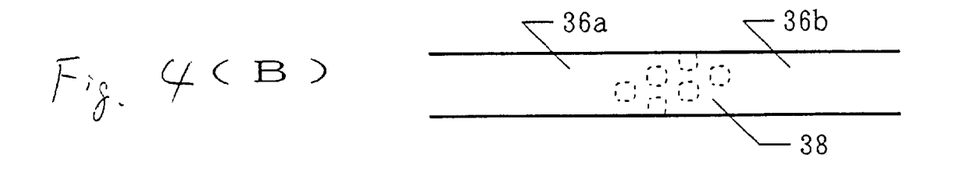

Rather, the crystal boundary is present in perpendicular to the proceeding direction of carriers, and TFT having the portion in the channel forming region has a pinning effect of suppressing the extension of the depletion layer. Accordingly, higher reliability and characteristics can be obtained as compared not only with TFT having no step of removing the catalyst element but also TFT obtained by using crystals oriented by using the catalyst element (for example, as shown in Japanese Patent Laid-Open No. 7-664256) (FIG. 3(B) and FIG. 4(B)).

In the crystalline silicon film caused to grow laterally by using a catalyst element for promoting the crystallization of the amorphous silicon film, the catalyst element can be removed continuously by controlling the atmosphere and the temperature. Thus, electronic devices of high reliability using crystalline silicon films can be provided in a great amount.

The present invention has been described with reference to the preferred embodiments. However, it is to be understood that the present invention should not be limited to those preferred embodiments and many modifications may be made without departing from the scope of the appended claims. For example, while a top-gate TFT was disclosed in the embodiment, another type of TFT such as a bottom-gate type TFT may be used.

What is claimed is:

1. A method of manufacturing a crystalline semiconductor comprising:
    a first step of forming a mask film having an element introduction aperture on a semiconductor film comprising amorphous silicon,
    a second step of forming a film comprising at least one element in the element introduction aperture,
    a third step of crystallizing the semiconductor film at a lateral direction by a heat treatment and
    a fourth step of heat treating the semiconductor film in a gas containing a halogen compound and oxygen after the third step,
    wherein the third step and the fourth step are conducted continuously.

2. A method of manufacturing a crystalline semiconductor according to claim 1, wherein the method includes a step of irradiating a laser light or a similar intense light to the crystallized semiconductor film after the fourth step.

3. A method of manufacturing a crystalline semiconductor according to claim 1, wherein an oxide film of a thickness of 100 Å or less is formed on the semiconductor film at the portion for the element introduction aperture in the first step.

4. A method of manufacturing a crystalline semiconductor according to claim 1, wherein the third step and the fourth step are conducted in one identical device.

5. A method of manufacturing a crystalline semiconductor according to claim 1, wherein said element is selected from Ni, Pd, Pt, Cu, Ag, Au, In, Sn, P, As and Sb.

6. A method of manufacturing a crystalline semiconductor according to claim 1, wherein said element is selected from those belonging to the groups VIII, IIIb, IVb, and Vb.

7. A method of manufacturing a crystalline semiconductor according to claim 1, wherein the temperature upon transferring from the third step to the fourth step is 450° C. or higher.

8. A method of manufacturing a crystalline semiconductor according to claim 1, wherein the gas introduction in the fourth step has a partial pressure of nitrogen and a rare gas of from 20 to 95% and a partial pressure of oxygen of from 6 to 40%.

9. A method of manufacturing a crystalline semiconductor according to claim 1, wherein the gas introduced in the fourth step contains 0.5% or more of hydrogen chloride.

10. A method of manufacturing a crystalline semiconductor according to claim 1, wherein the film comprising at least one element is deposited by a sputtering method in the second step.

11. A method of manufacturing a crystalline semiconductor according to claim 1, wherein the film comprising at least one element is deposited by a gas phase growth method in the second step.

12. A method of manufacturing a crystalline semiconductor according to claim 1, wherein the film comprising at least one element is deposited by a spin coating method in the second step.

13. A method of manufacturing a semiconductor device comprising the steps of:
    forming a semiconductor film comprising silicon over a substrate;
    forming a mask having an opening over said semiconductor film;
    providing said semiconductor film with a material through the opening of the mask, said material having a capability of promoting crystallization of said semiconductor film;
    heating said semiconductor film and said material to crystallize said semiconductor film; and then
    removing said material from the crystallized semiconductor film through the opening of said mask.

14. A method of manufacturing a semiconductor device according to claim 13 wherein said mask comprises silicon oxide.

15. A method of manufacturing a semiconductor device comprising the steps of:
    forming a semiconductor film comprising silicon over a substrate;
    forming a mask having an opening over said semiconductor film;
    providing said semiconductor film with a material through the opening of the mask, said material having a capability of promoting crystallization of said semiconductor film;
    heating said semiconductor film and said material to crystallize said semiconductor film; and then
    heating said semiconductor film after the crystallization in an atmosphere containing a halogen compound, thereby removing said material from the crystallized semiconductor film through the opening of said mask.

16. A method of manufacturing a semiconductor device according to claim 15 wherein said mask comprises silicon oxide.

17. A method of manufacturing a semiconductor device comprising the steps of:
    forming a semiconductor film comprising silicon over a substrate;
    providing said semiconductor film with a material, said material having a capability of promoting crystallization of said semiconductor film;
    heating said semiconductor film and said material to a temperature 450° C. or higher, thereby crystallizing said semiconductor film; and then
    exposing said semiconductor film in an atmosphere containing a halogen compound while maintaining the temperature of said semiconductor film not lower than 450° C., thereby removing said material from the crystallized semiconductor film,
    wherein said atmosphere has a partial pressure of nitrogen and a rare gas of from 20 to 95% and a partial pressure of oxygen of from 6 to 40%.

18. A method of manufacturing a semiconductor device according to claim 17 wherein said atmosphere is an oxidizing atmosphere.

19. A method of manufacturing a semiconductor device according to claim 13 wherein said material is selected from Ni, Pd, Pt, Cu, Ag, Au, In, Sn, P, As and Sb.

20. A method of manufacturing a semiconductor device according to claim 15 wherein said material is selected from Ni, Pd, Pt, Cu, Ag, Au, In, Sn, P, As and Sb.

21. A method of manufacturing a semiconductor device according to claim 17 wherein said material is selected from Ni, Pd, Pt, Cu, Ag, Au, In, Sn, P, As and Sb.

22. A method of manufacturing a semiconductor device according to claim 13 wherein said semiconductor device is an active matrix type liquid crystal display device.

23. A method of manufacturing a semiconductor device according to claim 15 wherein said semiconductor device is an active matrix type liquid crystal display device.

24. A method of manufacturing a semiconductor device according to claim 17 wherein said semiconductor device is an active matrix type liquid crystal display device.

25. A method of manufacturing a crystalline semiconductor comprising:
   a first step of forming a mask film having an element introduction aperture on a semiconductor film comprising amorphous silicon;
   a second step of forming a film comprising at least one element in the element introduction aperture;
   a third step of crystallizing the semiconductor film at a lateral direction by a heat treatment; and
   a fourth step of heat treating the semiconductor film in a gas containing a halogen compound and oxygen after the third step,
   wherein a temperature upon transferring from the third step to the fourth step is 450° C. or higher.

26. A method of manufacturing a crystalline semiconductor according to claim 25, wherein said mask film comprises silicon oxide.

27. A method of manufacturing a crystalline semiconductor according to claim 25, wherein one or plurality of elements selected from Ni, Pd, Pt, Cu, Ag, Au, In, Sn, P, As and Sb as the element is used.

28. A method of manufacturing a crystalline semiconductor according to claim 25, wherein the gas contains 0.5% or more of hydrogen chloride.

29. A method of manufacturing a crystalline semiconductor comprising:
   a first step of forming a mask film having an element introduction aperture on a semiconductor film comprising amorphous silicon;
   a second step of forming a film comprising at least one element in the element introduction aperture;
   a third step of crystallizing the semiconductor film at a lateral direction by a heat treatment; and
   a fourth step of heat treating the semiconductor film in a gas containing a halogen compound and oxygen after the third step,
   wherein the gas has a partial pressure of nitrogen and a rare gas of from 20 to 95% and a partial pressure of oxygen of from 6 to 40%.

30. A method of manufacturing a crystalline semiconductor according to claim 29, wherein said mask film comprises silicon oxide.

31. A method of manufacturing a crystalline semiconductor according to claim 29, wherein the element is selected from Ni, Pd, Pt, Cu, Ag, Au, In, Sn, P, As and Sb.

32. A method of manufacturing a crystalline semiconductor according to claim 29, wherein the gas contains 0.5% or more of hydrogen chloride.

33. A method of manufacturing a crystalline semiconductor comprising:
   a first step of forming a mask film having an element introduction aperture on a semiconductor film comprising amorphous silicon;
   a second step of forming a film comprising at least one element in the element introduction aperture;
   a third step of crystallizing the semiconductor film at a lateral direction by a heat treatment; and
   a fourth step of heat treating the semiconductor film in a gas containing a halogen compound and oxygen after the third step,
   wherein said element is removed during said fourth step through said element introduction aperture.

34. A method of manufacturing a crystalline semiconductor according to claim 33, wherein said mask film comprises silicon oxide.

35. A method of manufacturing a crystalline semiconductor according to claim 33, wherein the element is selected from Ni, Pd, Pt, Cu, Ag, Au, In, Sn, P, As and Sb.

36. A method of manufacturing a crystalline semiconductor according to claim 33, wherein the gas contains 0.5% or more of hydrogen chloride.

37. A method of manufacturing a semiconductor device comprising the steps of:
   forming a semiconductor film comprising silicon over a substrate;
   forming a mask having an opening over said semiconductor film;
   providing said semiconductor film with a material through the opening of the mask, said material having a capability of promoting crystallization of said semiconductor film;
   heating said semiconductor film and said material to crystallize said semiconductor film; and
   removing said material from the crystallized semiconductor film,
   wherein said heating and said removing are conducted continuously.

38. A method of manufacturing a semiconductor device according to claim 37, wherein said mask comprises silicon oxide.

39. A method of manufacturing a semiconductor device according to claim 37, wherein said material is selected from Ni, Pd, Pt, Cu, Ag, Au, In, Sn, P, As and Sb.

40. A method of manufacturing a semiconductor device according to claim 37, wherein said heating and said removing are conducted in one identical device.

41. A method of manufacturing a semiconductor device according to claim 37 wherein said semiconductor device is an active matrix type liquid crystal display device.

42. A method of manufacturing a semiconductor device comprising the steps of:
   forming a semiconductor film comprising silicon over a substrate;
   forming a mask having an opening over said semiconductor film;
   providing said semiconductor film with a material through the opening of the mask, said material having a capability of promoting crystallization of said semiconductor film;
   heating said semiconductor film and said material to crystallize said semiconductor film; and
   removing said material from the crystallized semiconductor film,
   wherein a temperature upon transferring from said heating to said removing is 450° C. or higher.

43. A method of manufacturing a semiconductor device according to claim 42, wherein said mask comprises silicon oxide.

44. A method of manufacturing a semiconductor device according to claim 42, wherein said material is selected from Ni, Pd, Pt, Cu, Ag, Au, In, Sn, P, As and Sb.

45. A method of manufacturing a semiconductor device according to claim 42, wherein said heating and said removing are conducted in one identical device.

46. A method of manufacturing a semiconductor device according to claim 42 wherein said semiconductor device is an active matrix type liquid crystal display device.

47. A method of manufacturing a semiconductor device comprising the steps of:

forming a semiconductor film comprising silicon over a substrate;

forming a mask having an opening over said semiconductor film;

providing said semiconductor film with a material through the opening of the mask, said material having a capability of promoting crystallization of said semiconductor film;

first heating said semiconductor film and said material to crystallize said semiconductor film; and second heating said semiconductor film after the crystallization in an atmosphere containing a halogen compound, thereby removing said material from the crystallized semiconductor film, wherein said first heating and said second heating are conducted continuously.

48. A method of manufacturing a semiconductor device according to claim 47, wherein said mask comprises silicon oxide.

49. A method of manufacturing a semiconductor device according to claim 47, wherein said material is selected from Ni, Pd, Pt, Cu, Ag, Au, In, Sn, P, As and Sb.

50. A method of manufacturing a semiconductor device according to claim 47, wherein said atmosphere contains 0.5% or more of hydrogen chloride.

51. A method of manufacturing a semiconductor device according to claim 47, wherein said first heating and said second heating are conducted in one identical device.

52. A method of manufacturing a semiconductor device according to claim 47 wherein said semiconductor device is an active matrix type liquid crystal display device.

53. A method of manufacturing a semiconductor device comprising the steps of:

forming a semiconductor film comprising silicon over a substrate;

forming a mask having an opening over said semiconductor film;

providing said semiconductor film with a material through the opening of the mask, said material having a capability of promoting crystallization of said semiconductor film;

first heating said semiconductor film and said material to crystallize said semiconductor film; and second heating said semiconductor film after the crystallization in an atmosphere containing a halogen compound, thereby removing said material from the crystallized semiconductor film, wherein a temperature upon transferring from said first heating to said second heating is 450° C. or higher.

54. A method of manufacturing a semiconductor device according to claim 53, wherein said mask comprises silicon oxide.

55. A method of manufacturing a semiconductor device according to claim 53, wherein said material is selected from Ni, Pd, Pt, Cu, Ag, Au, In, Sn, P, As and Sb.

56. A method of manufacturing a semiconductor device according to claim 53, wherein said atmosphere contains 0.5% or more of hydrogen chloride.

57. A method of manufacturing a semiconductor device according to claim 53, wherein said first heating and said second heating are conducted in one identical device.

58. A method of manufacturing a semiconductor device according to claim 53 wherein said semiconductor device is an active matrix type liquid crystal display device.

59. A method of manufacturing a semiconductor device comprising the steps of:

forming a semiconductor film comprising silicon over a substrate;

forming a mask having an opening over said semiconductor film;

providing said semiconductor film with a material through the opening of the mask, said material having a capability of promoting crystallization of said semiconductor film;

first heating said semiconductor film and said material to crystallize said semiconductor film; and second heating said semiconductor film after the crystallization in an atmosphere containing a halogen compound, thereby removing said material from the crystallized semiconductor film, wherein said atmosphere has a partial pressure of nitrogen and a rare gas from 20 to 95% and a partial pressure of oxygen of from 6 to 40%.

60. A method of manufacturing a semiconductor device according to claim 59, wherein said mask comprises silicon oxide.

61. A method of manufacturing a semiconductor device according to claim 59, wherein said material is selected from Ni, Pd, Pt, Cu, Ag, Au, In, Sn, P, As and Sb.

62. A method of manufacturing a semiconductor device according to claim 59, wherein said atmosphere contains 0.5% or more of hydrogen chloride.

63. A method of manufacturing a semiconductor device according to claim 59, wherein said first heating and said second heating are conducted in one identical device.

64. A method of manufacturing a semiconductor device according to claim 59 wherein said semiconductor device is an active matrix type liquid crystal display device.

* * * * *